United States Patent [19]

Simanapalli et al.

[11] Patent Number: 6,002,726

[45] Date of Patent: Dec. 14, 1999

[54] FM DISCRIMINATOR WITH AUTOMATIC GAIN CONTROL FOR DIGITAL SIGNAL PROCESSORS

[75] Inventors: Sivanand Simanapalli, Allentown, Pa.; Xiao-An Wang, Morristown, N.J.

[73] Assignee: Lucent Technologies Inc., Murray Hill, N.J.

[21] Appl. No.: 08/975,997

[22] Filed: Nov. 21, 1997

[51] Int. Cl.⁶ .............................. H04L 27/08; H03D 3/00; G06F 7/52

[52] U.S. Cl. ........................... 375/345; 329/341; 364/765

[58] Field of Search ............................ 375/345; 329/315, 329/311, 341, 343; 342/115, 195; 364/736.01, 761, 765

[56] References Cited

U.S. PATENT DOCUMENTS

| | | | |
|---|---|---|---|
| 4,893,316 | 1/1990 | Janc et al. ................................. | 375/261 |
| 5,623,521 | 4/1997 | Yaguchi et al. .......................... | 375/345 |
| 5,757,858 | 5/1998 | Black et al. .............................. | 375/295 |

Primary Examiner—Stephen Chin
Assistant Examiner—Albert Park
Attorney, Agent, or Firm—Darby & Darby

[57] ABSTRACT

A method of extracting an information bearing signal $\omega(n)$ from a base-band signal in the form of an inverse function with a digital signal processor. The processor includes memory and utilizes a minimum number of instructions stored in the memory. The base-band waveform comprises a plurality of complex-valued samples having respective I and Q components. The method includes the steps of receiving a first sample at an instant n having respective $I(n)$ and $Q(n)$ components and defining an interval for evaluating potential values for the $I(n)$ and $Q(n)$ components. Next, a step of transforming said $I(n)$ and $Q(n)$ components is performed to have respective threshold values residing in the predefined interval. Then, a step of estimating the transformed components with a series of non-inverted polynomial functions is carried out over the predefined interval. The method proceeds by extracting the information-bearing signal with the digital signal processor according to the instructions to evaluate the series of non-inverted polynomial functions.

15 Claims, 3 Drawing Sheets

FM DISCRIMINATOR WITH AUTOMATIC GAIN CONTROL FOR DIGITAL SIGNAL PROCESSORS

FIELD OF THE INVENTION

The invention relates to digital frequency modulation (FM) discriminators and methods for extracting signals from a demodulated waveform, and more particularly a discriminator and method utilizing automatic gain control to minimize instruction cycles in a digital signal processor.

BACKGROUND OF THE INVENTION

A popular technique for demodulating FM signals in a telecommunications receiver involves employing a discriminator to extract the signal of interest. Typically, once received, a modulated FM signal is converted to base band by extracting the in-phase (I) and quadrature-phase (Q) components where:

$I(t) = a(t) \cos \phi(t)$;

$Q(t) = a(t) \sin \phi(t)$;

$\phi(t) = \int \omega(\tau) d\tau$; and $\omega(\tau)$ is the information bearing signal.

Once the I and Q components are determined, the discriminator operation evaluates the quantity:

$$I(t)Q'(t) - Q(t)I'(t) = \alpha^2(t)\phi'(t) = \alpha^2(t)\omega(t)$$

where ' denotes the derivative. In cases where the envelope $a(t)$ is constant, the discriminator produces an output proportional to the information bearing signal $\omega(t)$.

In data communications applications, $\omega(t)$ is typically a multilevel pulse-amplitude modulation (PAM) signal. Many applications for such signals include more than two signal levels to achieve greater information processing capacity. However, in establishing multiple signal levels, the probabilities of decisional errors increase substantially. To combat this problem, a set of thresholds for classifying the signals can be optimally determined to achieve the lowest possible decision error probabilities.

Optimally selecting sets of thresholds theoretically presents an acceptable solution to the problems involved in multi-level demodulation of signals within a relatively constant envelope. Realistically however, the envelope $a(t)$ always changes, together with the output levels of the discriminator. When this occurs, the predetermined thresholds are no longer optimum and performance degradations in terms of error bit rate increase.

To minimize fluctuations in the envelope, conventional analog discriminators employ additional automatic gain control AGC circuitry to maintain $a(t)$ within an acceptable band of values. Unfortunately, conventional analog AGC circuits have been found to reduce performance degradations only to a limited extent. Moreover, typical wireless channels often exhibit frequency fadings where $a(t)$ has sudden and dramatic changes for which the AGC cannot adapt at all.

In the digital domain, an information-bearing signal may be explicitly extracted without any dependency on the envelope by employing a digital signal processor (DSP) to evaluate the relation:

$$\frac{I(n)Q'(n) - I'(n)Q(n)}{I^2(n) + Q^2(n)} = \omega(n)$$

The relationship above represents a digital discriminator including a special type of AGC that eliminates the adverse effect of the envelope fluctuation. While this relationship works well to solve the problem of gain fluctuation, evaluation of the inverse function embedded therein typically requires an undesirably high number of instruction cycles. For example, implementation of the inverse function 1/x in the instruction language of the DSP16000 processor available from Lucent Technologies, requires 55 cycles. This is mainly attributeable to the multiplicative and additive nature of most DSP's.

DSP architectures are typically designed to maximize processing speed with a finite number of processor instructions. With each instruction taking a certain amount of time to carry out, eliminating unnecessary instructions substantially increases a DSPs' performance. One common performance or efficiency benchmark utilized in the industry takes into account the number of MIPs, or millions of instructions per second, that the DSP is capable of carrying out. The greater the number, the more efficient the architecture is considered.

One approach to evaluate an inverse function utilizing a DSP assumes that the squared components of I and Q remain constant over several samples. Unfortunately, this technique fails to solve the problem associated with the unacceptably high number of cycles required to carry out the inversion operation.

Therefore, the need exists for an FM digital discriminator and method utilizing automatic gain control to extract signals defined by an inverse function from demodulated signals with a minimum number of instruction cycles on the part of the DSP. The discriminator and method of the present invention satisfy these needs.

The discriminator and method of the present invention allow digital signal processors to extract signals characterized by an inverse function from FM demodulated waveforms with a minimum number of instruction cycles. By minimizing instruction cycles, the DSP's limited instruction resources may be conserved to carry out additional functions and improve processor efficiency.

To realize the advantages above, the invention in one form comprises a method for use with a digital signal processor to extract an information bearing signal $\omega(n)$ from a base-band signal in the form of an inverse function. The processor includes memory and utilizes a minimum number of instructions stored in the memory. The base-band waveform comprises a plurality of complex-valued samples having respective I and Q components. The method includes the steps of receiving a first sample at an instant n having respective I(n) and Q(n) components and defining an interval for evaluating potential values for the I(n) and Q(n) components. Next, said I(n) and Q(n) components are transformed so as to have respective threshold values residing in the predefined interval. Then, a step of estimating the transformed components with a series of non-inverted polynomial functions is carried out over the predefined interval. The method proceeds by extracting the information-bearing signal with the digital signal processor operating according to the instructions to evaluate the series of non-inverted polynomial functions.

In another form, the invention comprises an FM discriminator for use in a digital signal processor to extract an information-bearing signal from a base-band signal. The base-band signal is in the form of an inverse function and comprises a plurality of complex-valued samples having respective I and Q components. The discriminator includes an input for receiving a first sample at an instant n having respective I(n) and Q(n) components, a memory, and logic disposed in communication with said input and the memory. The logic defines an interval for evaluating potential values for said I(n) and Q(n) components, then transforms the I(n) and Q(n) components to have respective threshold values residing in the predefined interval. The logic also estimates the transformed components with a series of non-inverted polynomial functions over the predefined interval, and extracts the information-bearing signal by means of the digital signal processor, to evaluate the series of non-inverted polynomial functions. The logic then stores the extracted signal in the memory.

BRIEF DESCRIPTION OF THE DRAWINGS

Other features and advantages of the present invention will be apparent from the following detailed description when read in conjunction with the accompanying drawings, wherein.

DETAILED DESCRIPTION OF THE INVENTION

The number of MIPs, or millions of instructions per second, that a processor can perform often serves as an important indicator of the processors' overall performance. As a corollary to this performance indicator, operations that can be carried out with a minimum number of instructions typically enhance the MIPs number by freeing up valuable instructions for other operations.

Data communications equipment often utilize DSP's in an effort to improve signal quality and performance. For such applications, a received FM modulated signal is carried in terms of zeroes and ones with modulation based on frequency-shift-keying, or FSK. This form of modulation establishes a plurality of thresholds (in multiples of two) to increase the information capacity of the signals.

Figure 1:
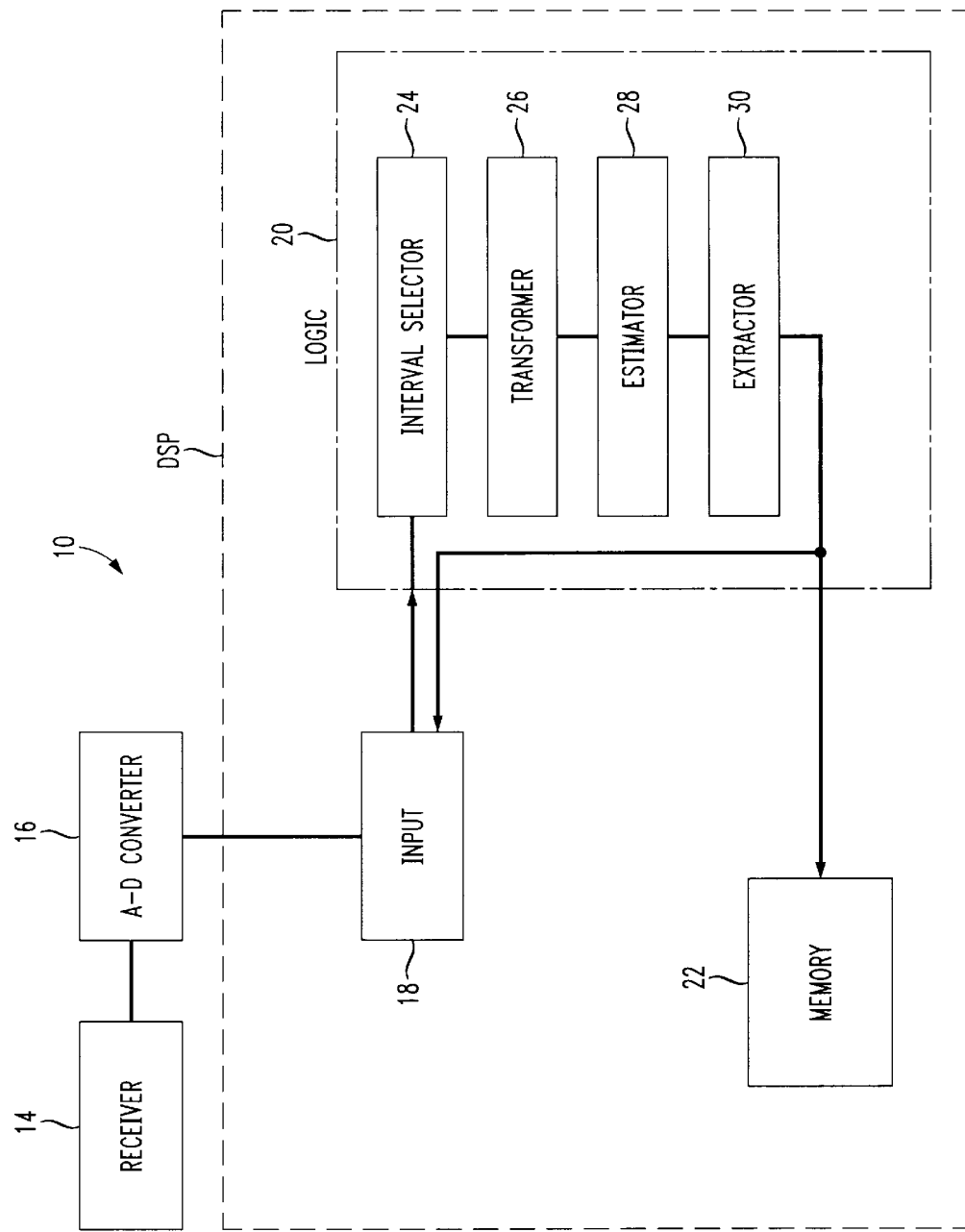
FIG. 1 is a block diagram of an FM discriminator according to one embodiment of the present invention.

Referring now to FIG. 1, the FM discriminator of the present invention, generally designated 10, includes logic unit 20 that allows a digital signal processor DSP to extract an information-bearing signal $\omega$ in the form of an inverse function having a denominator term in a manner that maximizes gain control, and minimizes the number of instructions required by the DSP to carry out the extraction process.

Further referring to FIG. 1, the signal $\omega$ comprises a plurality of complex-valued samples originally detected by a receiver 14 as an FM modulated analog signal, then converted into digital information via an analog-digital converter 16 which breaks the signal down into respective in-phase I and quadrature-phase Q samples, or components. The DSP then receives the samples through an input 18 and directs the signals to the DSP logic 20.

The DSP logic 20 may take the form of any DSP architecture utilizing, for example, multipliers and accumulators responsive to programmed instructions residing in a memory 22. The instructions define respective logic blocks including an interval selector 24 for defining an interval along which to evaluate the received samples, and a transformer 26 for transforming the respective I and Q components to have respective threshold values residing in the selected interval. An estimator 28 cooperates with the transformer to approximate the transformed I and Q components with a series of non-inverted polynomial functions. Receiving the output of the estimator is an extractor 30 for extracting the information-bearing signal according to a predetermined relationship and storing the extracted value in the memory 22.

Figure 2:
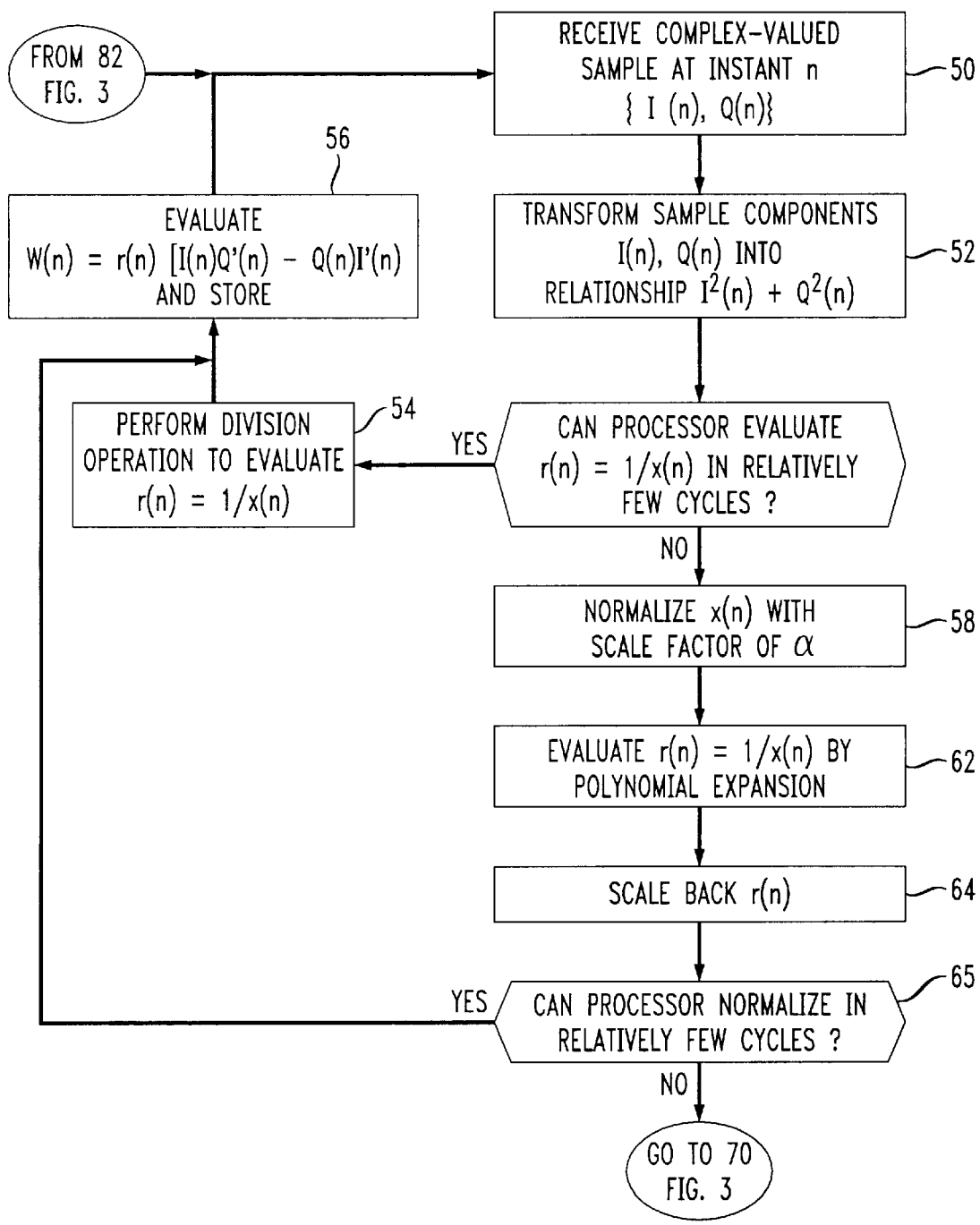
FIG. 2 is a block diagram illustrating one embodiment of the method of the present invention.

Operation of the discriminator 10 proceeds according to software instruction steps that define the method of the present invention. Referring now to FIG. 2, the method begins at step 50, with receiving at the input 18 a complex-valued sample at instant n having respective I(n) and Q(n) components. The components are fed to the transformer 26 for squaring the respective components and summing the two squared values according to the relationship $x(n)=I^2(n)+Q^2(n)$ (step 52).

If the DSP includes resources that allow it to evaluate the expression $1/x(n)$ in relatively few cycles (test at step 53), then a direct division operation is carried out at step 54, followed by an evaluation of the relationship $r(n)[I(n)Q'(n)-Q(n)I'(n)]$ to extract $\omega(n)$, at step 56. Once $\omega(n)$ is determined, the value is stored in the memory 22, and a subsequent sample is received to begin the process again, at step 50.

Should the processor lack the resources to carry out a direct division operation of the form $1/x$ in an acceptable number of instruction cycles, the respective transformed components $I^2(n)$ and $Q^2(n)$ undergo further modification. The further processing is performed in order to substitute for the result of the division operation a value approximated by a polynomial expansion having no denominator component in any of its terms. Such an approximation requires a limited and predefined interval in which the expansion is to be carrier out.

We have discovered that a Chebyshev approximation over the interval $x\in[0.5,1]$ provides acceptable results with terms of the following:

$$1/x \approx 2.5859x^2 - 5.8182x + 4.2424$$

Chebyshev polynomials provide a convenient and rather accurate approximation to a minimax approximation of a function over an interval such as $[-1,1]$. This minimax approximation is an minimized. Least mean square techniques may also be employed as long as the approximation error is minimized.

Further referring to FIG. 2, in preparation for using a Chebyshev approximation, the respective $I^2(n)$ and $Q^2(n)$ components are first normalized, at step 58, by a scaling factor $\alpha$. The normalizing step places the components within the interval required for the Chebyshev approximation. Once the components are within the interval, the Chebyshev approximation is performed, at step 62, to estimate r(n). The estimated values are then scaled back, at step 64, by $1/\alpha$.

If the processor includes a bit manipulation unit BMU (test at step 65), which can carry out the normalizing step in only a few cycles, then the signal $\omega(n)$ is extracted by evaluating, at step 56, the relationship: $r(n)[I(n)Q'(n)-Q(n)I'(n)]$. The process is then iteratively repeated for the next sample n+1 received, at step 50. However, in processors that do not employ a BMU, the normalization step is quite expensive in terms of the number of instructions required to process.

For example, the following is a segment of DSP16000 code that performs the method steps of FIG. 2 (the DSP16000 has a BMU):

```
                a0 = *r0        /*get x*/
a0 = norm(a0, ar0)              /*normalization*/
        y = a0    x = *r1 ++    /*x = 2.5829*/
        p = x*y   a0 = *r1 ++   /*p = 2.5859x; a0 = -5.8182*/
a0 = a0 + p  p = x*y  a1 = *r1 ++  /*p = (-5.8182 + 2.5859x)x; a1 = 4.2424*/
x = a0
        p = x*y
a1 = a1 + p                     /*a1 = 1/x*/
```

Figure 3:
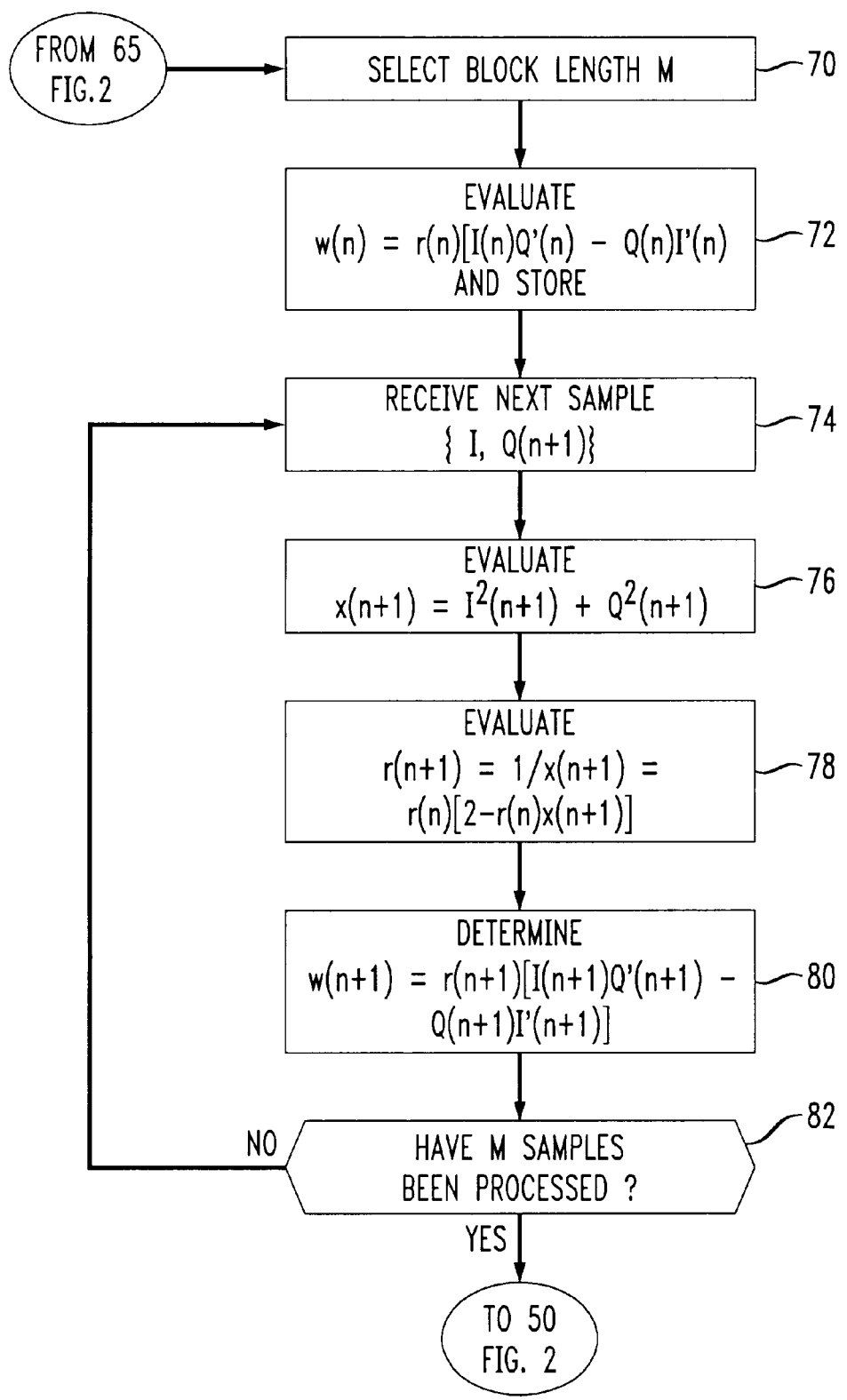
FIG. 3 illustrates further steps included in the embodiment of the method of the present invention.

For BMU-less DSP's, the 1-cycle instruction a0=norm (a0,ar0) is no longer available and has to be replaced with code that performs the same function but consumes several cycles. FIG. 3 illustrates additional "tracking" steps according to the present invention that enable a BMU-less DSP to estimate $\omega(n)$ with a minimum number of instructions. The sub-method involves first selecting a block of M samples adjacent to the previously received sample, at step 70. The I and Q components from the previous sample are then evaluated, at step 72, to determine the relationship r(n)[I(n)Q'(n)−Q(n)I'(n)]. After storing the result in the memory 22, the next sample having components I(n+1) and Q(n+1) is received at the DSP input 18, at step 74. Similar to the sample at instant n, the I and Q sample components at instant n+1 are modified and processed, at step 76, to evaluate the relationship $x(n+1)=I^2(n+1)+Q^2(n+1)$.

We have determined that by letting r(n)=1/x(n) be the inverse obtained from the sample at instant n, and recognizing that the envelope changes between adjacent samples are very small if the sampling rate is sufficiently high, the following relationship holds true:

$$x(n+1)r(n) = \frac{x(n+1)}{x(n)} = 1 + d, d \ll 1.$$

Thus, the inverse for the current sample r(n+1)=1/x(n+1) can be approximated by $$r(n+1) = \frac{1}{x(n+1)} = \frac{1}{x(n)(1+d)} = \frac{r(n)}{1+d} \approx r(n)(1-d) = r(n)[2 - r(n)x(n+1)]$$

To continue the tracking sub-method, the relationship r(n)[2−r(n)x(n+1)] is evaluated to obtain r(n+1), at step 78. Once the quantity r(n+1) has been evaluated, $\omega(n+1)$ is then determined, at step 80, from the relationship $\omega(n+1)=r(n+1)[I(n+1)Q'(n+1)−Q(n+1)I'(n+1)]$. The result is stored into the memory and then a determination is made, at step 82, whether the group of M samples have been processed. If not, the tracking sub-method iteratively repeats, at step 74, for the next sample at instant n+2. When the group of M samples have been processed, the entire extraction method begins again with the receiving step 50 (FIG. 2) for a new sample.

An example of a segment of code implementing the tracking sub-method is reproduced below as a DSP 16000 code segment:

```
      y = a1  x = *r0   /*x = x(n+1); y = r(n)*/
   p = x*y  a0 = *r1    /*a0 = 2*/
a0 = a0 - p              /*a0 = 2 - x(n+1)r(n)*/
      x = a0
      p = x*y
a1 = p                   /*a1 = r(n)[2 - x(n+1)r(n)]*/
```

The above code executes in six cycles. For large groups of M samples, such as M=10, the average cycles are kept well below 10. We have verified our assumption regarding the envelope changes between consecutive samples by measuring the fading environment of tie envelope, which typically lasts for durations of from 5 to 10 milliseconds. Occasionally, the fading duration is as low as 1 millisecond. For a standard application in a device having a sample rate of 38.4 kHz, or 26 microseconds, the worst case scenario involves about forty samples per fade, thereby justifying the assumption.

Those skilled in the art will appreciate the many benefits and advantages offered by the present invention. Of significant importance is the signal processing capability of extracting a digital signal from a waveform of the type exhibiting an inverse function with denominator terms utilizing a minimum number of instruction cycles. This feature is possible through implementation of the unique signal processing approximation technique that modifies the I and Q components as a series of polynomials rather than an inverse quantity.

While the invention has been particularly shown and described with reference to the preferred embodiments thereof, it will be understood by those skilled in the art that various changes in form and detail may be made therein without departing from the spirit and scope of the invention.

What is claimed is:

1. A method performed with a digital signal processor having memory and utilizing a minimum number of instructions stored in said memory, for extracting from a waveform an information bearing signal $\omega(n)$ from a base-band signal in the form of an inverse function having a denominator component, said waveform comprising a plurality of complex-valued samples having respective I and Q components, said method including the steps of:

receiving a first sample of the waveform at instant n having respective I(n) and Q(n) components;

defining a range for evaluating potential values for said I(n) and Q(n) components;

transforming said I(n) and Q(n) components so as to have respective threshold values residing in said predefined range;

determining a number of instruction cycles required for said digital processor to carry out a direct division operation of the form $1/x$;

where said number of instructions cycles is greater than a predetermined number, estimating said transformed components with a series of non-inverted polynomial functions over said predefined interval; and extracting said information-bearing signal with said digital signal processor according to said instructions evaluating said series of non-inverted polynomial functions.

2. A method according to claim 1 wherein said step of estimating includes the step of converting said transformed components utilizing a least mean square technique.

3. A method according to claim 2 wherein said step of defining includes the step of:

selecting said interval as (0.5,1).

4. A method according to claim 3 wherein said step of estimating includes the step of:

converting said signal function utilizing a Chebyshev approximation technique.

5. A method according to claim 4 wherein said step of converting includes the step of:

approximating said inverse function with the relationship $2.5859x^2 - 5.8182x + 4.2424$.

6. A method according to claim 5 wherein said step of transforming includes the steps of:

modifying said I(n) and Q(n) components into respective squared representations of I(n) and Q(n);

summing said squared representations of I(n) and Q(n) to generate a summed relation; and normalizing said summed relation to have respective values within said interval.

7. A method according to claim 6 wherein said step of normalizing includes the steps of:

determining a scale factor $\alpha$; and modifying said normalized relation by said scale factor $\alpha$.

8. A method according to claim 7 wherein after said step of estimating, said method further includes the step of:

scaling back said estimated I(n) and Q(n) components by $1/\alpha$.

9. A method according to claim 1 wherein said step of extracting includes the steps of:

evaluating the relationship $\omega(n)=r(n)(I(n)Q'(n)-Q(n)I'(n))$, where $r(n)$ is $1/x(n)$; and storing said evaluated relationship in said memory.

10. A method according to claim 1 and after said step of extracting, said method further including the steps of:

iteratively carrying out said steps of receiving, defining, transforming, estimating and extracting on subsequent samples to extract a multi-sample information-bearing signal.

11. A method according to claim 1 wherein said step of extracting includes the steps of:

selecting a plurality of M samples adjacent to said sample at instant n;

evaluating the relationship $\omega(n)=r(n)(I(n)Q'(n)-Q(n)I'(n))$;

storing said evaluated relationship in said memory; and tracking said adjacent samples by approximating each subsequent sample based on estimations of the most recently approximated sample.

12. A method according to claim 11 wherein said step of tracking includes the steps of:

receiving a subsequent sample having respective components I(n+1) and Q(n+1);

modifying said I(n+1) and Q(n+1) components into respective squared representations of I(n+1) and Q(n+1);

summing said squared representations of I(n+1) and Q(n+1) to generate a summed relation x(n+1);

evaluating the expression $r(n+1)=r(n)(2-r(n)x(n+1))$;

determining the relationship $\omega(n+1)=r(n+1)(I(n+1)Q'(n+1)-Q(n+1)I'(n+1))$; and iteratively carrying out said receiving, modifying, summing, evaluating and determining steps until the information-bearing signals from said M samples have been extracted.

13. The method according to claim 1 wherein said predetermined number is 55.

14. An FM discriminator for use in a digital signal processor to extract an information-bearing signal from a base-band signal, said base-band signal being in the form of an inverse function and comprising a plurality of complex-valued samples having respective I and Q components, said discriminator including:

an input for receiving at an instant n a first sample of said base-band signal having respective I(n) and Q(n) components;

a memory; and logic means disposed in communication with said input and said memory, said logic means including:

means for defining an interval for evaluating potential values for said I(n) and Q(n) components;

means for transforming said I(n) and Q(n) components to have respective threshold values residing in said predefined interval;

means for determining a number of instruction cycles required for said digital processor to carry out a direct division operation of the form $1/x$;

means for estimating said transformed components with a series of non-inverted polynomial functions over said predefined interval where said number of instructions cycles is greater than a predetermined number;

means for extracting said information-bearing signal with said digital signal processor according to said instructions by evaluating said series of non-inverted polynomial functions; and means for storing said extracted signal in said memory.

15. The discriminator according to claim 14 wherein said predetermined number is 55.

* * * * *